United States Patent
Shan et al.

(10) Patent No.: US 11,335,387 B2
(45) Date of Patent: May 17, 2022

(54) IN-MEMORY COMPUTING CIRCUIT FOR FULLY CONNECTED BINARY NEURAL NETWORK

(71) Applicant: SOUTHEAST UNIVERSITY, Nanjing (CN)

(72) Inventors: Weiwei Shan, Nanjing (CN); Tao Wang, Nanjing (CN)

(73) Assignee: SOUTHEAST UNIVERSITY, Nanjing (CN)

(*) Notice: Subject to any disclaimer, the term of this patent is extended or adjusted under 35 U.S.C. 154(b) by 67 days.

(21) Appl. No.: 17/042,921

(22) PCT Filed: Oct. 30, 2019

(86) PCT No.: PCT/CN2019/114226
§ 371 (c)(1),
(2) Date: Sep. 29, 2020

(87) PCT Pub. No.: WO2021/003899
PCT Pub. Date: Jan. 14, 2021

(65) Prior Publication Data
US 2021/0312959 A1 Oct. 7, 2021

(30) Foreign Application Priority Data
Jul. 11, 2019 (CN) .......................... 201910623458.5

(51) Int. Cl.
*G11C 7/06* (2006.01)
*G11C 7/10* (2006.01)
(Continued)

(52) U.S. Cl.
CPC ........... *G11C 7/1087* (2013.01); *G06N 3/063* (2013.01); *G11C 7/06* (2013.01); *G11C 7/106* (2013.01);
(Continued)

(58) Field of Classification Search
CPC ......... G11C 7/1087; G11C 7/06; G11C 7/106; G11C 7/12; G11C 8/08; G11C 7/062;
(Continued)

(56) References Cited

U.S. PATENT DOCUMENTS

2019/0206483 A1 7/2019 Bong
2020/0066363 A1* 2/2020 Yang .................. G11C 16/3454
(Continued)

FOREIGN PATENT DOCUMENTS

CN 101217059 A 7/2008
CN 104282326 A 1/2015
(Continued)

*Primary Examiner* — Hoai V Ho
*Assistant Examiner* — Minh Dinh
(74) *Attorney, Agent, or Firm* — Bayramoglu Law Offices LLC

(57) ABSTRACT

An in-memory computing circuit for a fully connected binary neural network includes an input latch circuit, a counting addressing module, an address selector, a decoding and word line drive circuit, a memory array, a pre-charge circuit, a writing bit line drive circuit, a replica bit line column cell, a timing control circuit, a sensitive amplifier and a NAND gate array, an output latch circuit and an analog delay chain. A parallel XNOR operation is performed in the circuit on the SRAM bit line, and the accumulation operation, activation operation and other operations are performed by the delay chain in the time domain. Partial calculation is completed while reading the data, and the delay chain with a small area occupation can be integrated with SRAM, thus reducing the energy consumption of the memory access process. Multi-column parallel computing also improves system throughput.

9 Claims, 16 Drawing Sheets

(51) Int. Cl.
  *G06N 3/063* (2006.01)
  *G11C 7/12* (2006.01)
  *G11C 8/08* (2006.01)
  *H03K 3/356* (2006.01)
  *H03K 19/21* (2006.01)

(52) U.S. Cl.
  CPC .................. *G11C 7/12* (2013.01); *G11C 8/08* (2013.01); *H03K 3/356191* (2013.01); *H03K 19/21* (2013.01)

(58) Field of Classification Search
  CPC .. G06N 3/063; H03K 3/356191; H03K 19/21; H03K 2005/00234
  USPC ..................................................... 365/189.05
  See application file for complete search history.

(56) References Cited

U.S. PATENT DOCUMENTS

2020/0169251 A1* 5/2020 Arp ...................... H03K 5/1534
2021/0232899 A1* 7/2021 Takamaeda .......... G06N 3/0481

FOREIGN PATENT DOCUMENTS

| CN | 204537702 U | 8/2015 |
| CN | 109427388 A | 3/2019 |
| CN | 109784483 A | 5/2019 |

* cited by examiner

| "-1" → "0" | | W ⊙ A |
|---|---|---|
| W | A | W×A |
| -1̶ 0 | -1̶ 0 | +1 |
| -1̶ 0 | +1 | -1̶ 0 |
| +1 | -1̶ 0 | -1̶ 0 |
| +1 | +1 | +1 |

FIG. 2

IN-MEMORY COMPUTING CIRCUIT FOR FULLY CONNECTED BINARY NEURAL NETWORK

CROSS REFERENCE TO THE RELATED APPLICATIONS

This application is the national phase entry of International Application No. PCT/CN2019/114226, filed on Oct. 30, 2019, which is based upon and claims priority to Chinese Patent Application No. 201910623458.5, filed on Jul. 11, 2019, the entire contents of which are incorporated herein by reference.

TECHNICAL FIELD

The present invention belongs to the technical field of basic electronic circuits, and more particularly, relates to an in-memory computing circuit for a fully connected binary neural network, which uses digital logic to realize forward propagation calculation of the fully connected neural network.

BACKGROUND

Deep learning promises unique advantages in image recognition, natural language processing and other fields. Dedicated neural network chips, therefore, have become area of focused research. FIG. 1 schematically shows the basic calculation process of a neural network, which includes performing a weighted summation of the activations of the previous layer, adding the bias, and obtaining an activation of the next layer through an activation function. This process can be organized into the form of matrix and vector multiplication, as shown in formula (1).

$$\begin{bmatrix} A_{21} \\ A_{22} \end{bmatrix} = f\left( \begin{bmatrix} W_{11} & W_{21} & W_{31} \\ W_{12} & W_{22} & W_{32} \end{bmatrix} \times \begin{bmatrix} A_{11} \\ A_{12} \\ A_{13} \end{bmatrix} + \begin{bmatrix} b_1 \\ b_2 \end{bmatrix} \right) \quad (1)$$

The activations and weights of traditional neural networks typically use high-precision floating-point numbers (32-bit or 16-bit). With the expansion of the network scale, a large number of multiply and accumulate (MAC) operations involved in the calculation process need large amounts of memory access, computational overhead and thus consume lots of power as well. This limits the application of neural networks in mobile devices. The binary neural network (BNN) proposed in recent years limits the activation and weight to 1 bit, whereby a large number of multiplication operations are simplified to exclusive or (XNOR) operations (as shown in FIG. 2), and accumulation operations are simplified to bit counting operations, that is, to count the number of 1s and the number of 0s in the XNOR result. The activation function is a sign function to determine whether the sum of the difference between the number of 1s and the number of 0s in the XNOR result and the bias is greater than 0. If the sum is greater than or equal to 0, output 1; otherwise, output 0. The basic calculation process is shown in FIG. 3.

The binary neural network significantly simplifies the computational overhead. Thus, memory access becomes a critical factor in system power consumption. As shown in FIG. 4, the accelerator based on the traditional Von Neumann architecture performs a multiply-accumulate operation, which needs to fetch 2 operands from the memory and put them in the registers, and then the arithmetic logic unit completes the XNOR logic. The operands involved in neural networks are often relatively long vectors, whereas the word length of general memory is relatively short (16-bit or 32-bit). This means that performing a vector-level MAC operation requires several memory accesses.

Since the memory access requires charging and discharging the bit line capacitance, and the memory and the arithmetic logic unit are physically connected via a long interconnected wire, frequent access to the memory and data movement will cause massive power consumption. The power needed is several orders of magnitude higher than that of the computation itself according to related research reports. Moreover, the word length of general memory also severely limits the computational throughput of neural networks. In order to solve the problem of power consumption waste and performance loss caused by "memory wall," research on in-memory computing has become an area of concentration in academia and industry. As shown in FIG. 5, this architecture does not have explicit memory accesses and implements calculations in parallel on the bit lines of the memory or integrates computational logic and storage together, thus reducing the power consumption waste caused by data movement. Additionally, the multi-column parallel mode of this architecture also diminishes the number of memory accesses, thereby improving the system performance.

SUMMARY

In view of the above-mentioned shortcomings in the prior art, an objective of the present invention is to provide an in-memory computing circuit for a fully connected binary neural network. The improved circuit uses the XNOR operation executed in parallel on the Static Random-access Memory (SRAM) bit line to (i) realize in-memory computing of the fully connected binary neural network, (ii) realize read-write separation of the memory cell while reducing the significant power consumption caused by data movement, and (iii) solve the technical problems that the neural network accelerator based on the traditional Von Neumann architecture consumes massive power consumption due to frequent memory accesses and data movement.

To achieve the above-mentioned objective(s), the present invention adopts the following technical solutions:

An in-memory computing circuit for a fully connected binary neural network includes an SRAM for performing XNOR operations and a delay chain for performing accumulation and activation operations. The in-memory computing circuit specifically includes: an input latch circuit, a counting addressing module, an address selector, a decoding and word line drive circuit, a memory array, a pre-charge circuit, a writing bit line drive circuit, a replica bit line column cell, a timing control circuit, a sensitive amplifier and a not-and (NAND) gate array, an output latch circuit and a delay chain.

The memory array is an SRAM array with M+1 rows and N columns, and configured to store the weights of the current layer and the activations of the previous layer. The memory array includes (M+1)×N memory cells, wherein M and N are integers between 16-512, M is determined by the number of neurons in the current layer, and N is determined by the number of neurons in the previous layer. The following matrix-vector multiplication operation:

$$M \times V = \begin{bmatrix} W_{0,0} & W_{0,1} & \cdots & W_{0,N-1} \\ W_{1,0} & W_{1,1} & \cdots & W_{1,N-1} \\ \vdots & \vdots & \ddots & \vdots \\ W_{M-1,0} & W_{M-1,1} & \cdots & W_{M-1,N-1} \end{bmatrix} \times \begin{bmatrix} A_0 \\ A_1 \\ \vdots \\ A_{N-1} \end{bmatrix},$$

after being mapped to the memory array, is converted as follows:

$$\begin{bmatrix} A_0 & A_1 & \cdots & A_{N-1} \\ W_{0,0} & W_{0,1} & \cdots & W_{0,N-1} \\ W_{1,0} & W_{1,1} & \cdots & W_{1,N-1} \\ \vdots & \vdots & \ddots & \vdots \\ W_{M-1,0} & W_{M-1,1} & \cdots & W_{M-1,N-1} \end{bmatrix},$$

wherein the first row stores the activations of the previous layer, and the following rows store the corresponding weights of the current layer. The XNOR operation, accumulation operation, activation operation and other operations are performed on the activations of the first row and the weights of the following rows in sequence under clock control.

Compared with the traditional 6-transistor cell, additional 3 read branch transistors are used in the memory cell of the memory array. The latch unit composed of the first metal oxide semiconductor (MOS) transistor to the fourth MOS transistor includes the first complementary MOS (CMOS) inverter and the second CMOS inverter, wherein the output terminal of the second CMOS inverter is connected to the input terminal of the first CMOS inverter. The gate of the fifth MOS transistor and the gate of the sixth MOS transistor are connected in parallel and then connected to a writing word line enable signal. The drain of the fifth MOS transistor is connected to the low-level discharge writing word line. The source of the fifth MOS transistor is connected in parallel with the input terminal of the first CMOS inverter and the output terminal of the second CMOS inverter. The drain of the sixth MOS transistor is connected to the low-level discharge writing word line, the source of the sixth MOS transistor is connected to the input terminal of the second CMOS inverter. The drain of the seventh MOS transistor is connected to the low-level discharge reading word line, and the gate of the seventh MOS transistor is connected to the output terminal of the first CMOS inverter and the input terminal of the second CMOS inverter. The drain of the eighth MOS transistor is connected to the high-level discharge reading word line, and the gate of the eighth MOS transistor is connected to the input terminal of the first CMOS inverter and the output terminal of the second CMOS inverter. The source of the seventh MOS transistor and the source of the eighth MOS transistor are connected in parallel with the drain of the ninth MOS transistor, the gate of the ninth MOS transistor is connected to a reading word line enable signal, and the source of the ninth MOS transistor is grounded. In a holding state, the writing word line enable signal and the reading word line enable signal are both at a low level, and the latch unit composed of the first MOS transistor to the fourth MOS transistor maintains the data. In a writing state, the reading word line enable signal is at a low level, and the writing word line enable signal is at a high level. The fifth and sixth MOS transistors connected to the input and output terminals of the latch unit are turned on. Data on the low-level discharge writing word line and data on the high-level discharge writing word line are written into the latch unit through the fifth MOS transistor and the sixth MOS transistor. In a reading state, the writing word line enable signal is at a low level, and the reading word line enable signal is at a high level, and the ninth MOS transistor is turned on. If the stored data is 1, the eighth MOS transistor is turned on and the seventh MOS transistor is turned off, so that the pre-charged high-level discharge reading word line discharges through the reading branch formed by the eighth MOS transistor and the ninth MOS transistor, and the high-level discharge reading word line does not discharge. If the stored data is 0, the seventh MOS transistor is turned on and the eighth MOS transistor is turned off, so that the pre-charged low-level discharge reading word line discharges through the reading branch formed by the seventh MOS transistor and the ninth MOS transistor, and the high-level discharge reading word line does not discharge. The memory cell adopts a read-write separation mechanism. In the process of reading data, internal data acts on the gates of the seventh and eighth MOS transistors to ensure that multiple rows of reading word lines can be simultaneously turned on without destroying the internal data.

The delay chain includes two delay chains, one of the two delay chains is used as an adjustable chain and the other delay chain is used as a reference chain. The inputs of the two delay chains are all connected to a clock signal, the output of the adjustable chain is connected to a data terminal of a D flip-flop, and the output of the reference chain is connected to a clock terminal of the flip-flop. Each of the two chains is composed of N customized 6-transistor delay cells, and the 6-transistor delay cell is composed of two-stage inverters, wherein the first-stage inverter is composed of a P-Channel Metal Oxide Semiconductor (PMOS) transistor and three N-Channel Metal Oxide Semiconductor (NMOS) transistors; and the second-stage inverter is an ordinary inverter composed of a PMOS transistor and an NMOS transistor.

By adopting the above technical solutions, the invention has the following advantages.

(1) In the present invention, a large number of bitwise XNOR operations required in the binary neural network are accomplished on the SRAM bit line through logic simplification and transformation. Namely, partial calculation is completed while the memory is accessed to apportion the memory access power consumption through the calculation, thus reducing the memory access power consumption to a certain extent. Multi-column parallel computing also improves system throughput. Compared with the accelerators adopting a von Neumann architecture, the computing circuit of the present invention can significantly reduce overall network power consumption and improve energy efficiency.

(2) The accumulation and activation operations of the binary neural network are executed in time domain. Compared with the traditional digital accumulator and comparator (configured to realize the sign function), the computing circuit of the present invention has lower power consumption and simpler structure, and thus can be deployed near the SRAM to shorten the physical path from the memory to the accumulator, and further diminish the power consumption overhead caused by data movement.

(3) The 9-transistor memory cell in the present invention realizes the read-write separation, and the discharge of the reading branch is realized through two discharge behaviors of the bit line capacitance to facilitate limiting the discharge swing of the bit line capacitance via the sensitive amplifier, which saves energy consumption and has improved reading and writing noise margin. In this way, the system can work at a lower voltage, which is conducive to reducing power consumption and improving energy efficiency. This can ensure that multiple rows of reading word lines can be simultaneously turned on without destroying the data, which is suitable for applications where multiple rows of word lines are turned on simultaneously.

BRIEF DESCRIPTION OF THE DRAWINGS

Figure 2:
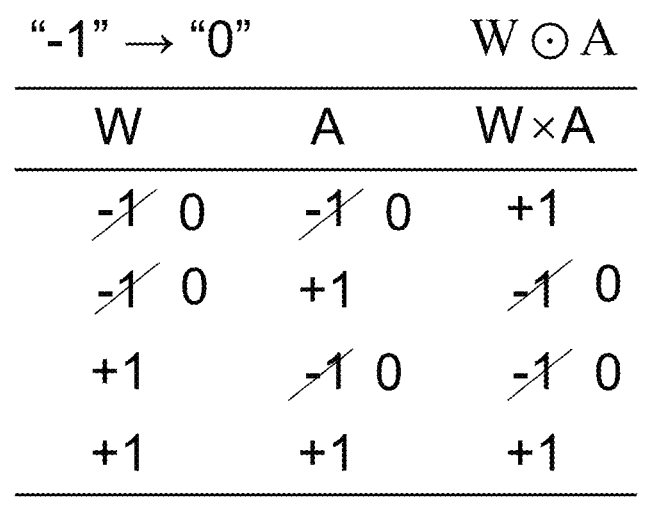

FIG. 2 is a truth table of an XNOR operation in the binary neural network;

In the figures: 1—input latch circuit; 2—counting addressing module; 3—address selector; 4—decoding and word line drive circuit; 5—memory array; 6—pre-charge circuit; 7—writing bit line drive circuit; 8—replica bit line column cell; 9—timing control circuit; 10—sensitive amplifier; 11—output latch circuit; 12—delay chain; M1-M9 are the first MOS transistor to the ninth MOS transistor.

DETAILED DESCRIPTION OF THE EMBODIMENTS

The technical solutions of the present invention will be described in detail below with reference to the drawings, but the scope of protection of the present invention is not limited to the embodiments.

In the present embodiment, a 36*36 fully connected layer is used as the design object (M=N=36), thus the XNOR-SRAM has 37 rows and 36 columns, and the system executes the following calculations:

$$A_{out} = \text{sign}\left(\begin{bmatrix} W_{0,0} & W_{0,1} & \cdots & W_{0,35} \\ W_{1,0} & W_{1,1} & \cdots & W_{1,35} \\ \vdots & \vdots & \ddots & \vdots \\ W_{35,0} & W_{35,1} & \cdots & W_{35,35} \end{bmatrix} \times \begin{bmatrix} A_0 \\ A_1 \\ \vdots \\ A_{35} \end{bmatrix} + \begin{bmatrix} b_0 \\ b_1 \\ \vdots \\ b_{35} \end{bmatrix}\right).$$

Figure 1:
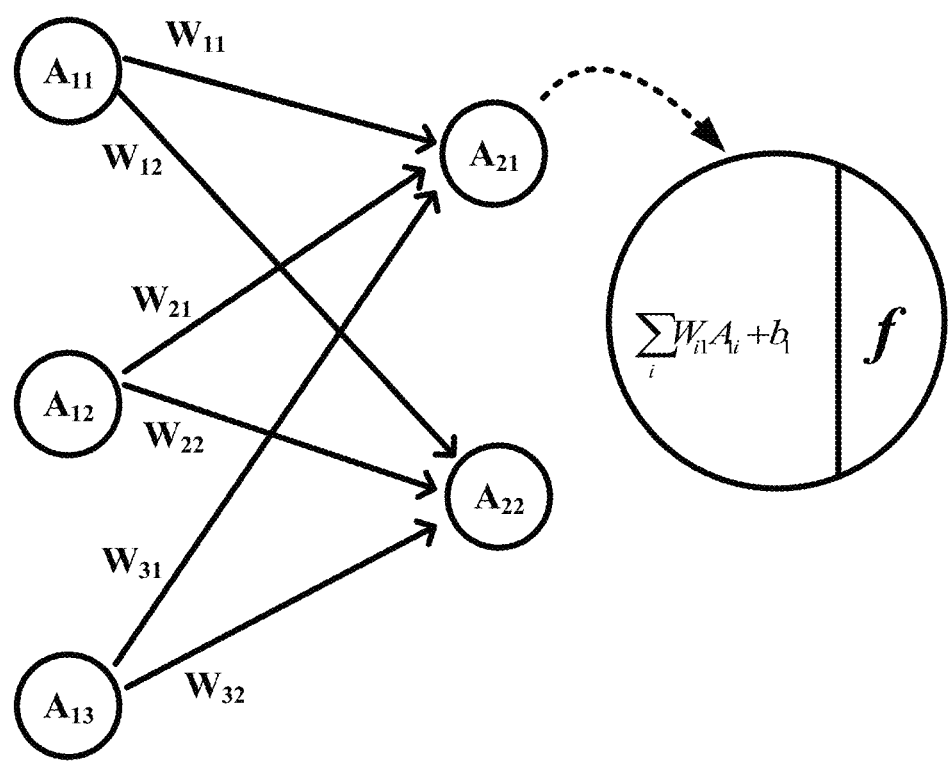
FIG. 1 is a schematic diagram of the basic calculation process of the neural network.
Figure 3:
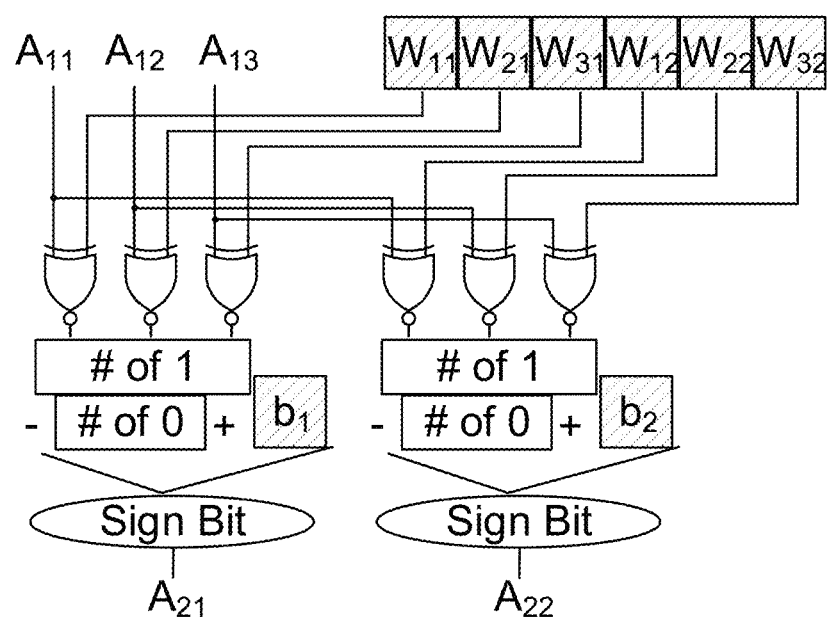
FIG. 3 schematically shows the basic computing circuit of the binary neural network.
Figure 4:
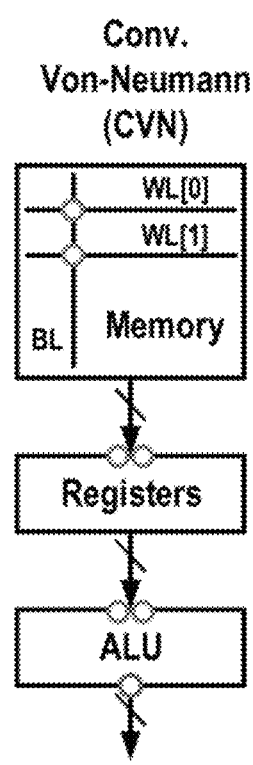
FIG. 4 schematically shows the traditional von Neumann architecture.
Figure 5:
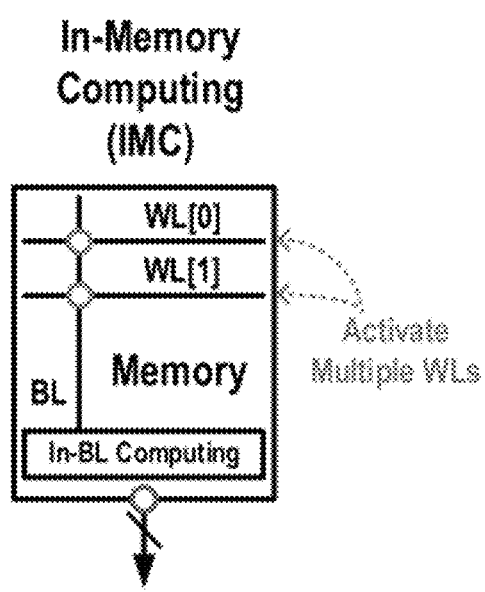
FIG. 5 is an in-memory computing architecture of the present invention.
Figure 6:
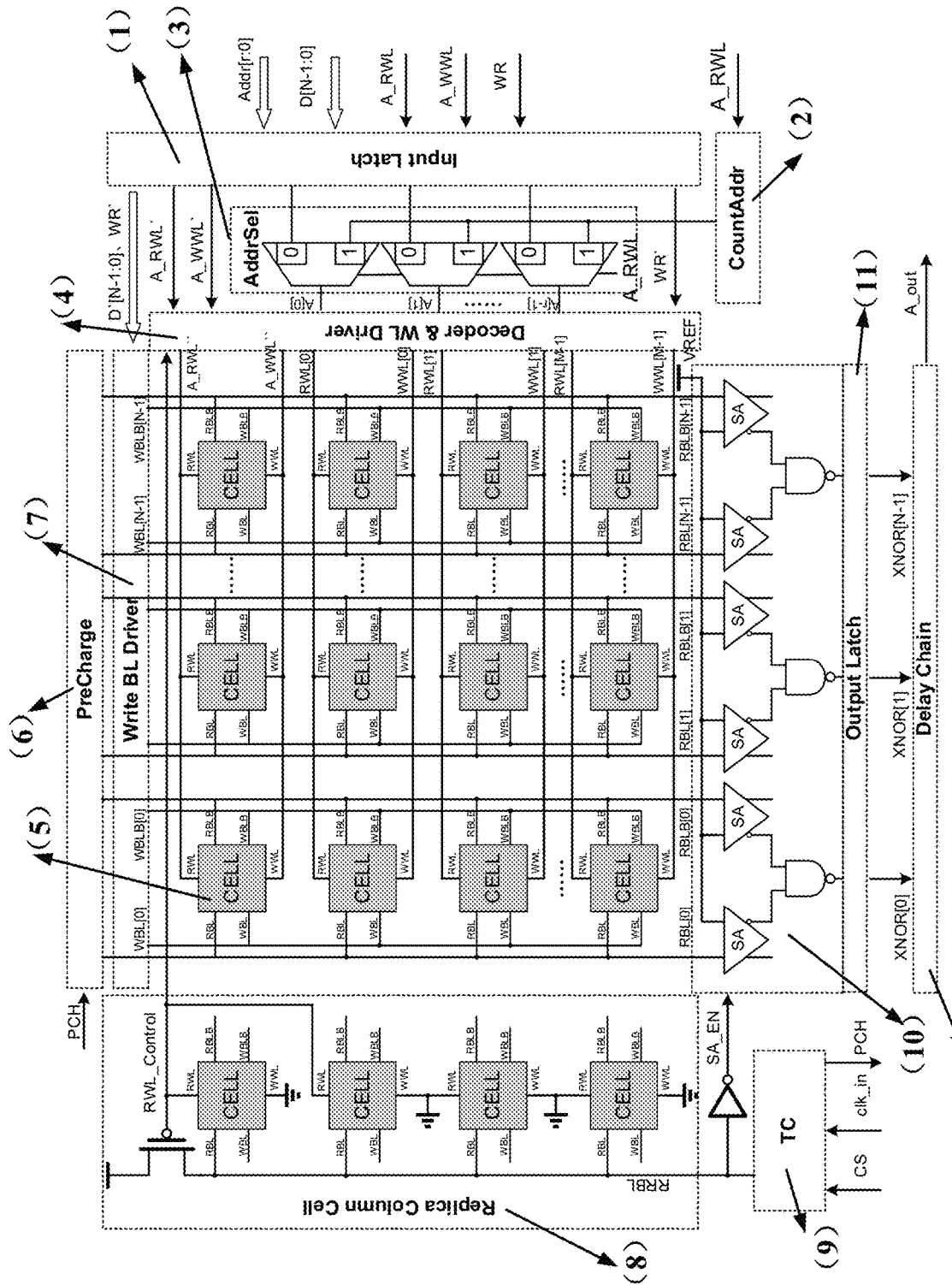
FIG. 6 is a system block diagram of the in-memory computing circuit of the present invention.

The system work is divided into two stages, including a data writing stage and an activation output stage, as shown in FIG. 6. In the data writing stage, the reading word line signal A_RWL of the row where the activation is located is at a low level, the read and write enable signal WR is at a low level, the counting addressing module 2 does not work, and the address selector 3 selects an external input address. The writing word line signal A_WWL of the row where the activation is located is first set high. After the activation A output by the previous layer is input and latched, the writing bit line drive circuit 7 writes the data into the first row. Then, A_WWL is pulled down, and the weight W and the corresponding address are sent to the input latch module 1, respectively. After the bit line is driven by the writing bit line drive module 7 and the corresponding word line is turned on by the decoding and word line drive circuit 4, the weight is written to the memory array. In the activation output stage, the reading word line signal A_RWL of the row where the activation is located and WR is pulled up, the reading word line of the row storing the activation is turned on in each clock cycle, and the counting addressing module starts to work. At this time, the address selector 3 selects the incremental address (0-35) output by the counting addressing module 2. After the 0-35 rows are sequentially turned on by the decoding and word line drive circuit 4, the XNOR operation is performed on the weights of each row and the activations of the first row. Finally, the output latch circuit 11 sends the XNOR result into the delay chain 12 for accumulation and activation operations to obtain the output activations of this layer.

For XNOR-SRAM, the input latch circuit 1, the decoding and word line drive circuit 4, the memory array 5, the pre-charge circuit 6, the writing bit line drive circuit 7, the replica bit line column cell 8, the timing control circuit 9, the sensitive amplifier 10 and the output latch circuit 11 can be designed according to the general SRAM design method. The difference is that the counting addressing module 2 and the address selector 3 are additionally provided.

Figure 7:
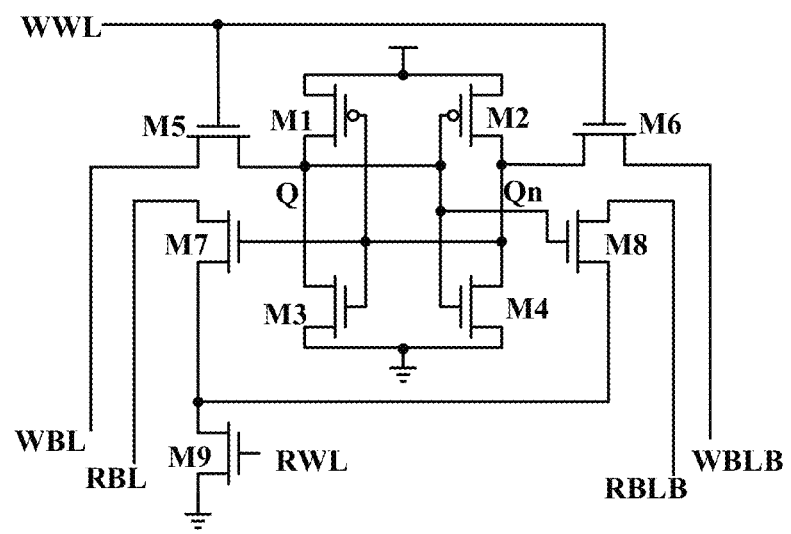
FIG. 7 is a 9-transistor memory cell with read-write separation.

As shown in FIG. 7, compared with the traditional 6-transistor cell, additional 3 read branch transistors are used in the memory cell of the memory array. The latch unit composed of the first MOS transistor M1 to the fourth MOS transistor M4 includes the first CMOS inverter and the second CMOS inverter, wherein the output terminal of the second CMOS inverter is connected to the input terminal of the first CMOS inverter. The gate of the fifth MOS transistor M5 and the gate of the sixth MOS transistor M6 are connected in parallel and then connected to the writing word line enable signal. The drain of the fifth MOS transistor M5 is connected to a low-level discharge writing word line. The source of the fifth MOS transistor M5 is connected in parallel with the input terminal of the first CMOS inverter and the output terminal of the second CMOS inverter. The drain of the sixth MOS transistor M6 is connected to a high-level discharge writing word line, and the source of the sixth MOS transistor M6 is connected to the input terminal of the second CMOS inverter. The drain of the seventh MOS transistor M7 is connected to the low-level discharge reading word line, and the gate of the seventh MOS transistor M7 is connected to the output terminal of the first CMOS inverter and the input terminal of the second CMOS inverter. The drain of the eighth MOS transistor M8 is connected to the high-level discharge reading word line, and the gate of the eighth MOS transistor M8 is connected to the input terminal of the first CMOS inverter and the output terminal of the second CMOS inverter. The source of the seventh MOS transistor M7 and the source of the eighth MOS transistor M8 are connected in parallel with the drain of the ninth MOS transistor M9, the gate of the ninth MOS transistor M9 is connected to a reading word line enable signal, and the source of the ninth MOS transistor M9 is grounded. In the holding state, the writing word line enable signal WWL and the reading word line enable signal RWL are both at a low level, and the latch unit composed of the first MOS transistor M1 to the fourth MOS transistor M4 maintains the data. In the writing state, the reading word line enable signal RWL is at a low level, and the writing word line enable signal WWL is at a high level. The fifth MOS transistor M5 and the sixth MOS transistor M6 connected to the input and output terminals of the latch unit are turned on. The data on the low-level discharge writing word line WBL and the data on the high-level discharge writing word line WBLB are written into the latch unit through the fifth MOS transistor M5 and the sixth MOS transistor M6. In the reading state, the writing word line enable signal WWL is at a low level, and the reading word line enable signal RWL is at a high level, and the ninth MOS transistor M9 is turned on. If the stored data is 1, i.e., Q=1, Qn=0, the eighth MOS transistor M8 is turned on and the seventh MOS transistor M7 is turned off, so that the pre-charged high-level discharge reading word line RBLB discharges through the reading branch formed by the eighth MOS transistor M8 and the ninth MOS transistor M9, and the low-level discharge reading word line RBL does not discharge. If the stored data is 0, i.e., Q=0, Qn=1, the seventh MOS transistor M7 is turned on and the eighth MOS transistor M8 is turned off, so that the pre-charged low-level discharge reading word line RBL discharges through the reading branch formed by the seventh MOS transistor M7 and the ninth MOS transistor M9, and the high-level discharge reading word line RBLB does not discharge.

Figure 8:
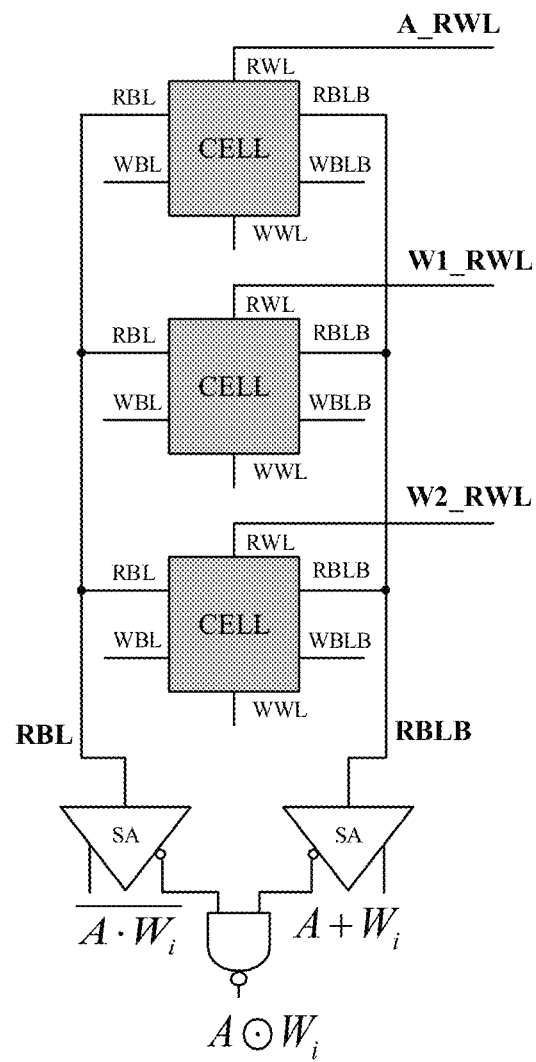
FIG. 8 is a schematic diagram of the XNOR operation performing on the XNOR-SRAM bit line.
Figure 9:
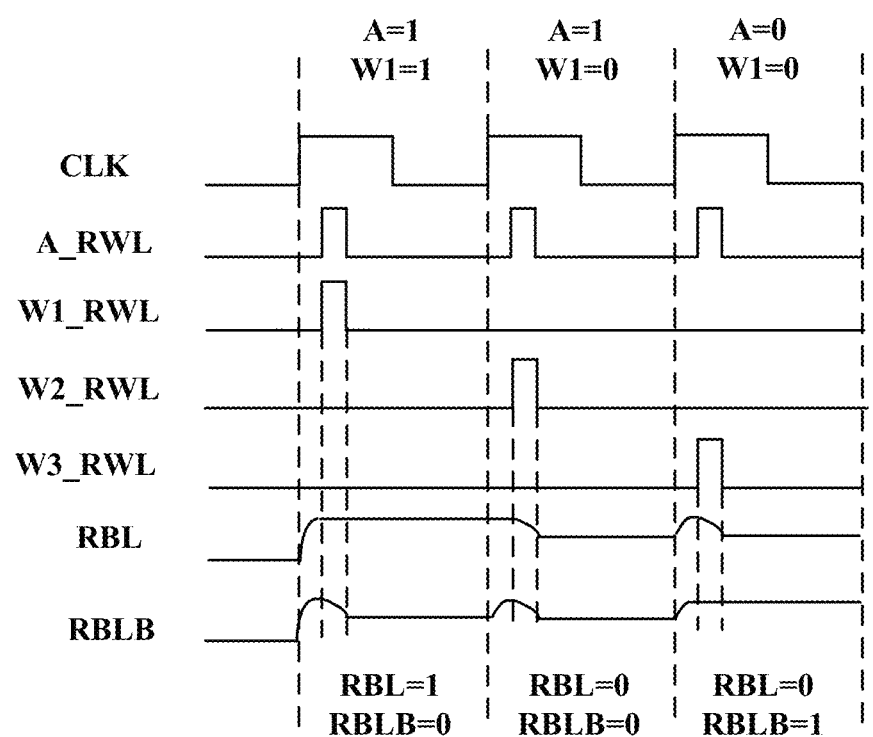
FIG. 9 is a timing waveform diagram of the XNOR operation performing on the XNOR-SRAM bit line.

The basic principle of the XNOR operation performed on the SRAM bit line is as follows. A single column is taken as an example, as shown in FIG. 8 and FIG. 9. As previously mentioned, the first row stores the activations of the previous layer, and the following rows store corresponding weights of the current layer. Each clock cycle, the reading word line A_RWL of the activation is enabled, and the reading word line Wi_RWL of each following row which stores weights is sequentially enabled. Since 2 rows are simultaneously activated in each clock cycle, for the low-level discharge reading word line RBL, if one of the activation A and the weight $W_i$ is 0, the low-level discharge reading word line will be discharged, that is, logically RBL=A·$W_i$. For the high-level discharge reading word line RBLB, if one of the activation A and $W_i$ is 1, the high-level discharge reading word line RBLB will be discharged, that is, logically RBLB=$\overline{A+W_i}$. RBL and RBLB realize the XNOR operation through the inversion of the sensitive amplifier itself and a NAND gate. As shown in formula (2):

$$\text{Out} = \overline{RBL \cdot RBLB} = \overline{A \bullet W_i \bullet (A + W_i)} \quad (2)$$
$$= \overline{A \bullet W_i} + \overline{A + W_i}$$
$$= \overline{A \bullet W_i} + \overline{A} \bullet \overline{W_i}$$
$$= A \odot W_i$$

Figure 12:
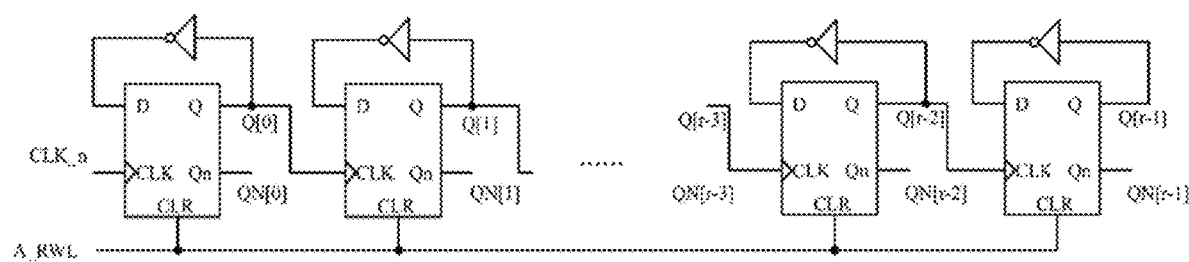
FIG. 12 is a schematic diagram of the counting addressing module.

FIG. 12 schematically shows the principle of the counting addressing module 2. Since N=36, r=⌈log₂ N⌉=6, the counting addressing module 2 is formed by 6 stages of D flip-flops with reset terminals connected in cascade. The data output terminal of the previous stage flip-flop is connected to the clock terminal of the next stage flip-flop, and the clock terminal of the first-stage flip-flop is connected to the inverted system clock CLK_n. The reset terminal of each flip-flop is connected to the activation reading enable signal A_RWL of the peripheral input. When A_RWL=0, the counting addressing module does not work, QN[5:0]=6'b000000. When A_RWL=1, the counting addressing module starts to work. QN[5:0] increases from 6'b000000 to 6'b100011 with the clock CLK_n sequentially to complete the traversal of the weight of each row.

Figure 13:
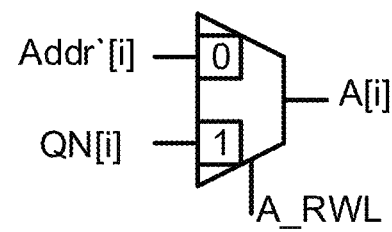
FIG. 13 is a schematic diagram of the address selector.

FIG. 13 schematically shows the principle of the address selector 3. Since N=36, r=⌈log₂ N⌉=6, the address selector 3 is composed of 6 two-to-one selectors. The "0" data terminal of each selector is connected to Addr'[5:0] output by the input latch circuit (1), and the "1" data terminal is connected to QN[5:0] output by the counting addressing module (2). The selection terminal is connected to the activation reading enable signal A_RWL. When A_RWL=0, the address selector selects the address Addr'[5:0] that the peripheral latches in. When A_RWL=1, the address selector selects the incremental address QN[5:0] generated by the counting addressing module.

Figure 10:
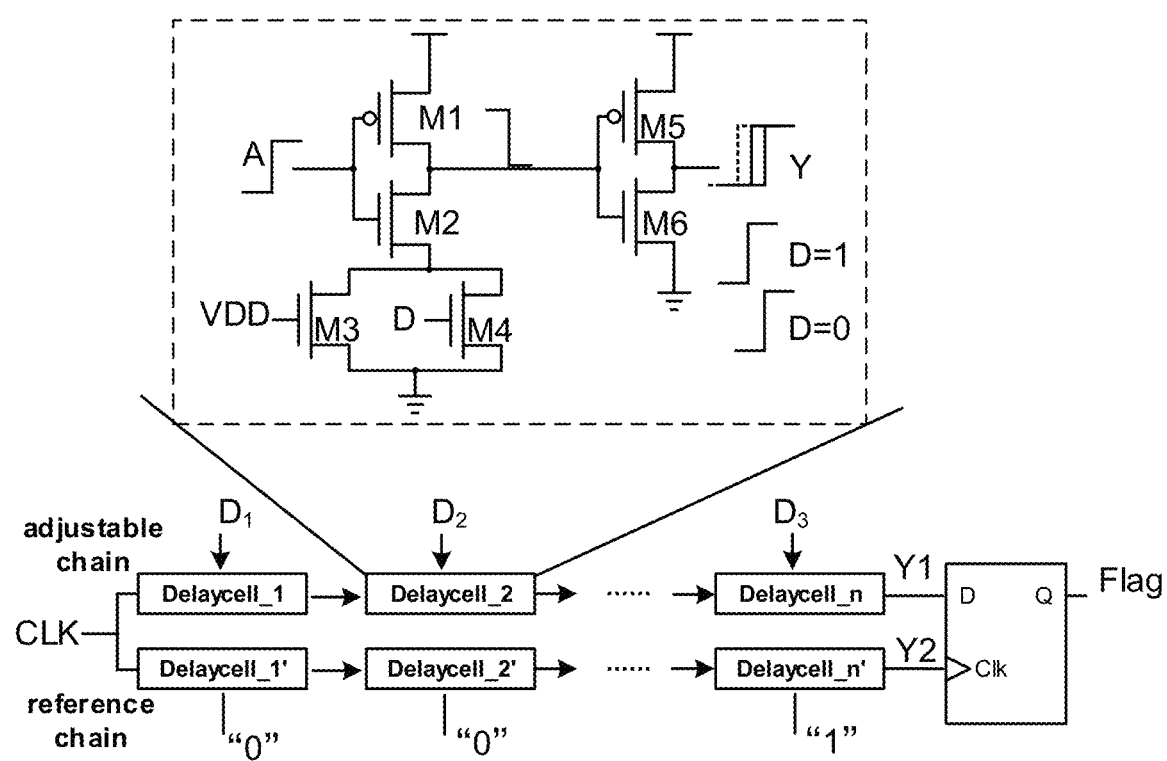
FIG. 10 is a schematic diagram of the delay chain.

For the delay chain shown in FIG. 10, the first-stage inverter in the delay cell is composed of 1 PMOS transistor M1 and 3 NMOS transistors M2-M4, and has a pull-down path that can be controlled by data D. When D=1, the pull-down path is M+M3∥M4 (wherein "+" represents series connection and "∥" represents parallel connection), the equivalent on-resistance is relatively small, thus making the delay relatively small. When D=0, the pull-down path is M2+M3, the equivalent on-resistance is relatively large, thus making the delay relatively large.

Figure 11:
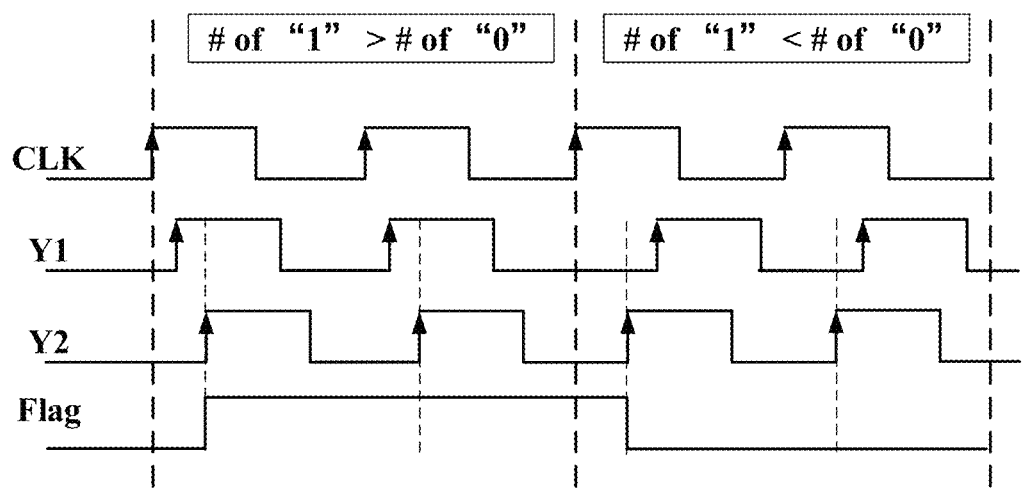
FIG. 11 is a timing diagram of the delay chain.

The basic principle of using the delay chain to perform accumulation and activation operations in time domain is as follows. N delay cells are contained in the reference chain, wherein the control terminal D of N/2 delay cells is connected to VDD, and the control terminal D of the remaining N/2 delay cells is connected to VSS. The control terminal D of the N delay cells in the adjustable chain is connected to the N XNOR results output by the XNOR-SRAM (namely, corresponding to N columns). As shown in FIG. 11, in the current clock cycle, if the number of "1" in the adjustable chain control signal is greater than the number of "0", that is, the number of "1" in the XNOR result is greater than the number of "0", the rising edge of the output Y1 of the adjustable chain reaches the D flip-flop before the output Y2 of the reference chain, and the output result FLAG=1. If the number of "1" in the adjustable chain control signal is less than the number of "0", that is, the number of "1" in the XNOR result is less than the number of "0", the rising edge of the output Y1 of the adjustable chain reaches the D flip-flop after the output Y2 of the reference chain, and the output result FLAG=0. In this way, the accumulation and activation operation of the XNOR result is realized in time domain. The bias term can be set by adjusting the relative number of "1" and "0" in the reference chain. If the bias term is 2, the number of "1" in the reference chain is less than the number of "0" by 2. Without bias, the number of "1" is equal to the number of "0" in the reference chain.

Both the reference chain and the adjustable chain are formed by 36 delay cells connected in cascade. The control end of each delay cell in the adjustable chain is connected to the 36 columns of XNOR results of the XNOR-SRAM. The relative number of the control signals "1" and "0" in the reference chain is dynamically adjusted through the register according to different bias terms.

After the in-memory computing circuit for the fully connected binary neural network is designed, the Simulation Program with Integrated Circuit Emphasis (HSPICE) tool is employed to perform post-layout simulation using a Taiwan Semiconductor Manufacturing Company (TSMC) 28 nm CMOS process.

Figure 14:
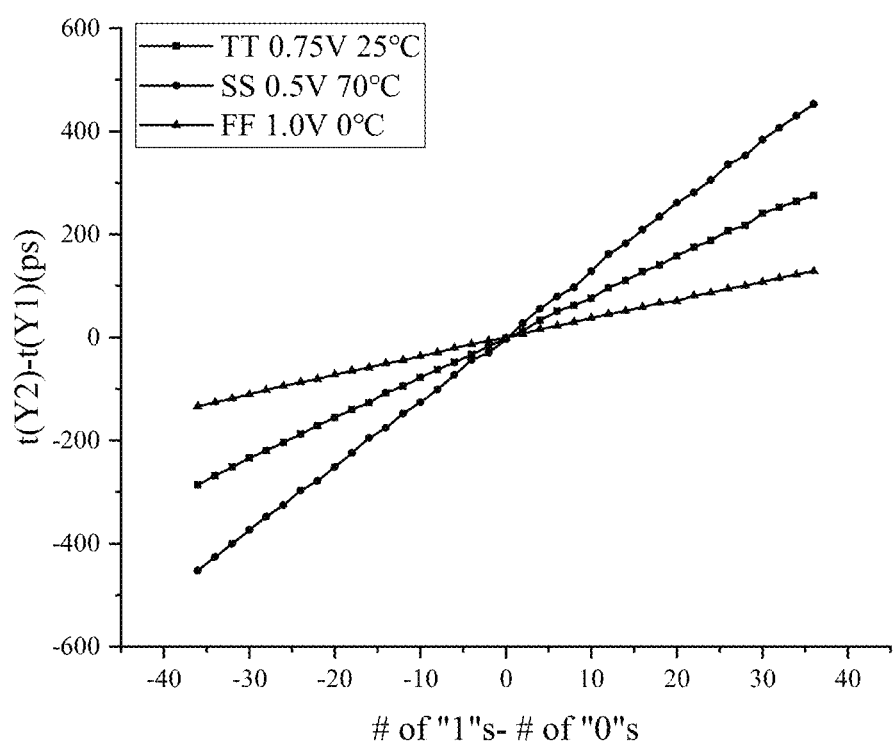
FIG. 14 schematically shows the simulation result of the delay chain.

FIG. 14 schematically shows the simulation result of the delay chain, wherein the abscissa represents the difference between the number of the control signal "1" and the number of the control signal "0" in the adjustable chain, and the ordinate represents the time difference between the rising edge of the output Y2 of the reference chain and the rising edge of the output Y1 of the adjustable chain. As can be seen from the figure, the difference between the rising edges of Y2 and Y1 and the difference between the number of "1" and "0" in the adjustable chain show a good linear relationship, so that a good accumulation effect can be achieved.

Figure 15:
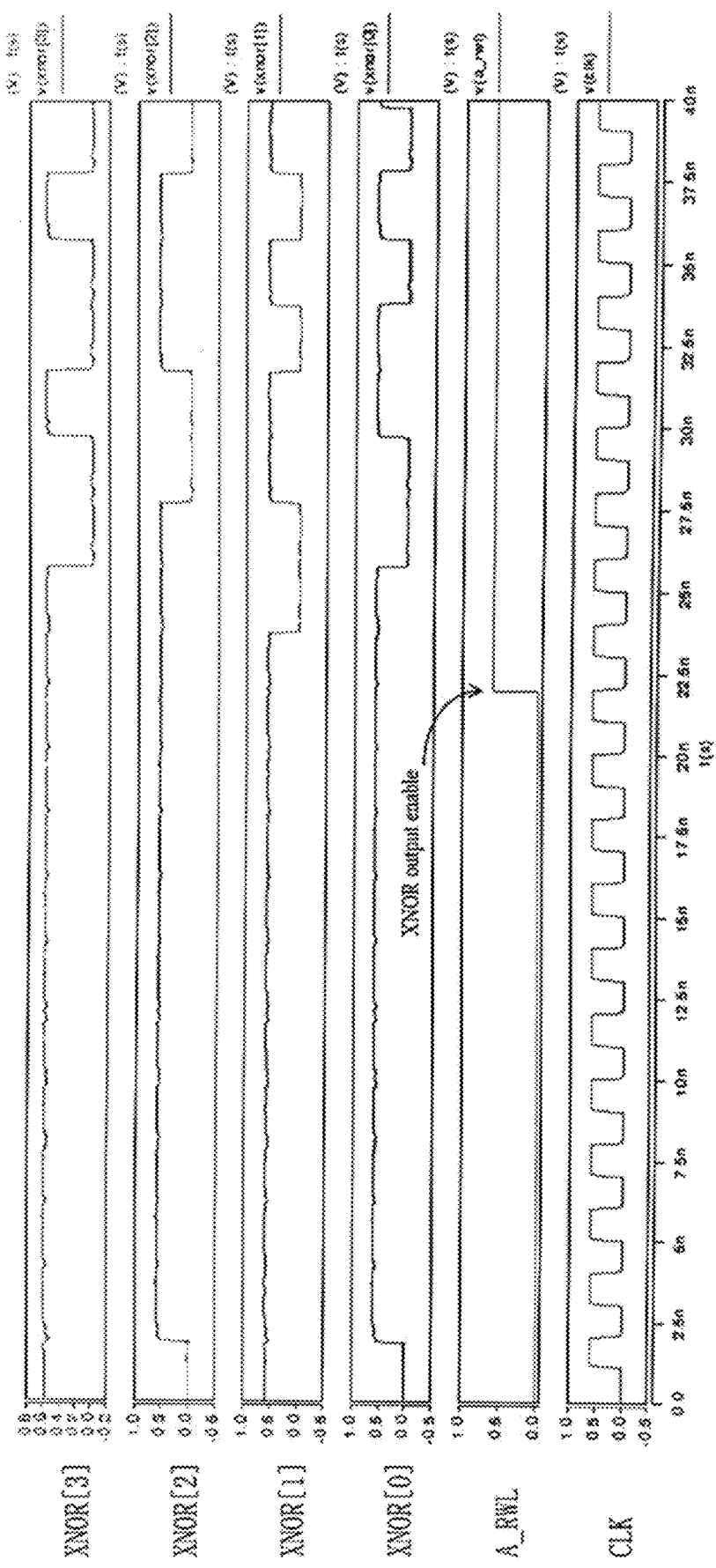
FIG. 15 schematically shows the simulation result of XNOR output by the XNOR-SRAM.

FIG. 15 schematically shows the simulation result of the XNOR operation performed on the XNOR-SRAM bit line, wherein CLK represents the system internal clock, A_RWL represents the activation reading enable signal, i.e., the XNOR output enable signal, and XNOR [0]-XNOR [3] represent the XNOR output signals of the first 4 columns, respectively. As can be seen from the figure, at an operating frequency of 500 MHz, when A_RWL is pulled up, XNOR [0]-XNOR [3] output the following data as expected:

$$XNOR[0] = A \odot W[0] = [1\ 0\ 0\ 1\ 1\ 0\ 1\ 0\ ...]$$
$$XNOR[1] = A \odot W[1] = [0\ 0\ 1\ 1\ 0\ 1\ 0\ 1\ ...]$$
$$XNOR[2] = A \odot W[2] = [1\ 1\ 0\ 0\ 1\ 1\ 1\ 0\ ...]$$
$$XNOR[3] = A \odot W[3] = [1\ 0\ 0\ 1\ 0\ 0\ 1\ 0\ ...].$$

Figure 16:
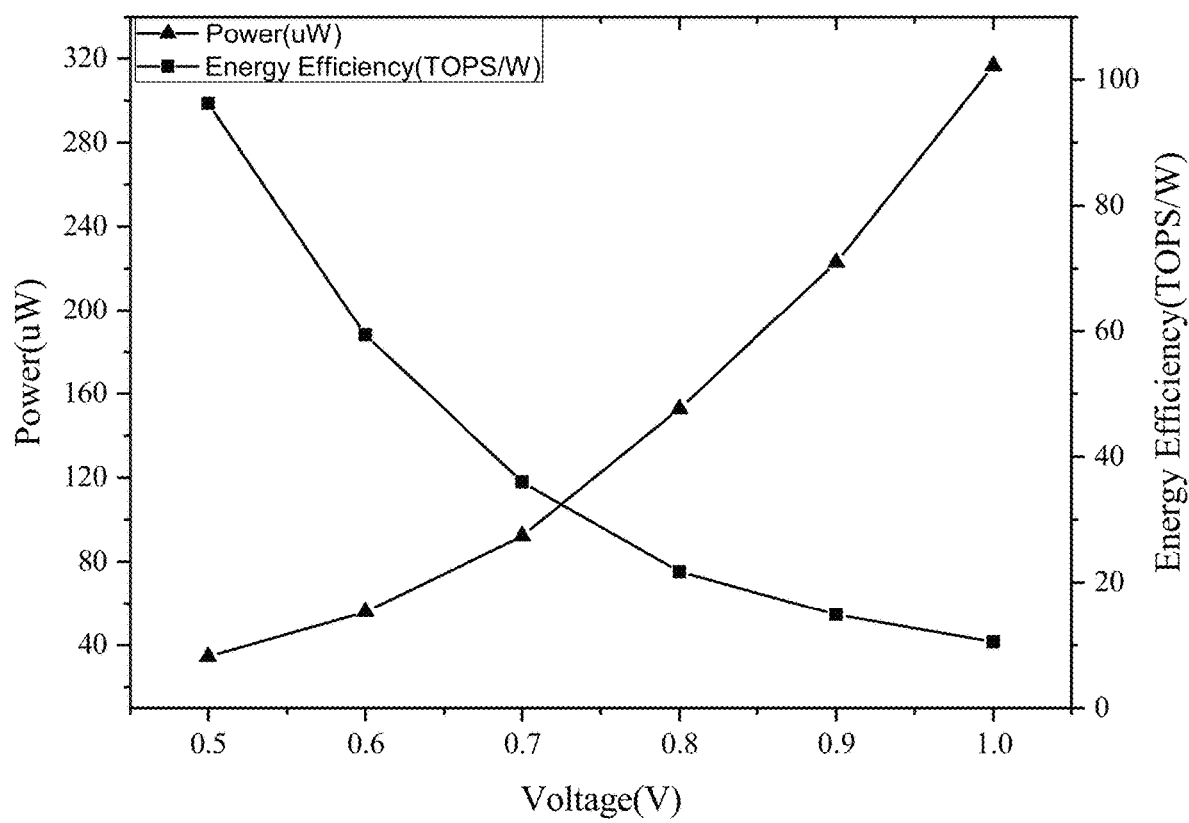
FIG. 16 is a schematic diagram of system power consumption and energy efficiency varying with operating voltage.

FIG. 16 schematically shows the simulation result of the power consumption and energy efficiency of the overall system under different operating voltages, wherein the abscissa represents the operating voltage, the ordinate on the left represents power consumption, and the ordinate on the right represents energy efficiency. As can be seen from the figure, as the operating voltage decreases, the power consumption decreases, and the energy efficiency is improved. The minimum operating voltage of the circuit can reach 0.5 V. At this time, the power consumption and energy efficiency are 34.526 uW and 96.249 TOPS/W, respectively, which are significantly improved compared with those of ordinary digital implementation.

What claimed is:

1. An in-memory computing circuit for a fully connected binary neural network, comprising:
    an input latch circuit, wherein the input latch circuit latches storage address from an outside and activations output from a previous layer;
    a memory array, wherein the memory array stores the activations output by the previous layer and weights of a current layer, and calculates the XNOR results between activations and weights through parallel XNOR operations on a bit line of the memory array;
    an output latch circuit, wherein the output latch circuit latches the XNOR results calculated by the memory array; and
    a delay chain, wherein the delay chain reads the activation output by the current layer stored in the output latch circuit to complete an accumulation and activation operation;
    wherein, the memory array comprises N columns of memory cells, each column of the memory cells comprise M+1 memory cells, wherein M is determined by a number of neurons in the current layer, and N is determined by a number of neurons in the previous layer, low-level discharge reading word lines of the each column of the memory cells are connected in parallel and then connected to an input terminal of a first sensitive amplifier, high-level discharge reading word lines of each column of the memory cells are connected in parallel and then connected to an input terminal of a second sensitive amplifier, an inverted output terminal of the first sensitive amplifier and the second sensitive amplifier connected to a reading word line of the same column of the memory cells is connected to input terminals of a NAND gate, and the NAND gate outputs the XNOR results calculated by the same column of memory cells.

2. The in-memory computing circuit according to claim 1, further comprising a pre-charge circuit configured to charge a bit line capacitance of the memory array.

3. The in-memory computing circuit according to claim 1, wherein, the memory cell comprises:
    a latch unit, wherein the latch unit is composed of a first MOS transistor, a second MOS transistor, a third MOS transistor and a fourth MOS transistor and comprises a first CMOS inverter and a second CMOS inverter, wherein an output terminal of the second CMOS inverter is connected to an input terminal of the first CMOS inverter;
    a fifth MOS transistor, wherein a drain of the fifth MOS transistor is connected to a low-level discharge writing word line, and a source of the fifth MOS transistor is connected in parallel with the input terminal of the first CMOS inverter and the output terminal of the second CMOS inverter;
    a sixth MOS transistor, wherein a drain of the sixth MOS transistor is connected to a high-level discharge writing word line, and a source of the sixth MOS transistor is connected to an input terminal of the second CMOS inverter;
    a seventh MOS transistor, wherein a drain of the seventh MOS transistor is connected to the low-level discharge reading word line, and a gate of the seventh MOS transistor is connected to an output terminal of the first CMOS inverter and the input terminal of the second CMOS inverter;
    an eighth MOS transistor, wherein a drain of the eighth MOS transistor is connected to the high-level discharge reading word line, and a gate of the eighth MOS transistor is connected to the input terminal of the first CMOS inverter and the output terminal of the second CMOS inverter; and
    a ninth MOS transistor, wherein a drain of the ninth MOS transistor is connected to a source of the seventh MOS transistor and a source of the eighth MOS transistor, a gate of the ninth MOS transistor is connected to a reading word line enable signal, and a source of the ninth MOS transistor is grounded.

4. The in-memory computing circuit according to claim 1, further comprising:
    a counting addressing module, wherein the counting addressing module does not work when the in-memory computing circuit works in a data writing stage, and the counting addressing module outputs an incremental address when the in-memory computing circuit works in an activation output stage; and an address selector, wherein the address selector selects the storage address from the outside by the input latch circuit when the in-memory computing circuit works in the data writing stage, and the address selector sequentially selects the incremental address when the in-memory computing circuit works in the activation output stage.

5. The in-memory computing circuit according to claim 4, wherein, the counting addressing module is formed by $\lceil \log_2 N \rceil$ D flip-flops with reset terminals connected in cascade, an output terminal of a previous stage D flip-flop is connected to a clock terminal of a next stage D flip-flop, and a clock terminal of a first-stage D flip-flop is connected an inverted system clock signal, a reset terminal of each D flip-flop of the $\lceil \log_2 N \rceil$ D flip-flops is connected to a reading word line enable signal of the first row, where the activation in the memory array read in from the outside by the input latch circuit is located in the first row, and the reading word line enable signal of the row is set to 0 in the data writing stage, and set to 1 in the activation output stage.

6. The in-memory computing circuit according to claim 4, wherein, the address selector comprises $\lceil \log_2 N \rceil$ two-to-one selectors, a "0" data terminal of each two-to-one selector of the $\lceil \log_2 N \rceil$ two-to-one selectors is connected to the storage address data latched by the input latch circuit, and a "1" data terminal of the each two-to-one selector is connected to the incremental address, and a selection terminal of the each two-to-one selector is connected to the reading word line enable signal of a row, wherein the activation in the memory array is located in the row, and outputs the storage address data latched by the input latch circuit when the reading word line enable signal of the row is set to 0, and outputs the incremental address when the reading word line enable signal of the row is set to 1.

7. An in-memory computing circuit for a fully connected binary neural network, comprising:

an input latch circuit, wherein the input latch circuit latches storage address from an outside and activations output from a previous layer;

a memory array, wherein the memory array stores the activations output by the previous layer and weights of a current layer, and calculates the XNOR results between activations and weights through parallel XNOR operations on a bit line of the memory array;

an output latch circuit, wherein the output latch circuit latches the XNOR results calculated by the memory array; and a delay chain, wherein the delay chain reads the activation output by the current layer stored in the output latch circuit to complete an accumulation and activation operation;

wherein, when the in-memory computing circuit works in a data writing stage, firstly, a writing word line of a first row, where the activation in the memory array is located, is enabled, the activations output by the previous layer are latched, then the activations output by the previous layer are written into the memory array, and then, a writing word line enable signal of the first row is pulled down, the weights of the current layer and storage address of the current layer are latched, and the weights of the current layer are written into the memory array according to the address of the current layer.

8. The in-memory computing circuit according to claim 7, wherein, a writing bit line drive circuit writes the activation output by the previous layer and weights of the current layer into the memory array according to the storage address of the previous layer.

9. The in-memory computing circuit according to claim 7, wherein, a writing bit line of a weight memory cell is driven by the writing bit line drive circuit, and the writing bit line of the weight memory cell is turned on by a decoding and word line drive module to write in the weight data.

* * * * *